United States Patent
Opris

(10) Patent No.: US 8,830,101 B1
(45) Date of Patent: Sep. 9, 2014

(54) SINGLE PHASE CLOCK D/A CONVERTER WITH BUILT-IN DATA COMBINER

(71) Applicant: Ion E. Opris, San Jose, CA (US)

(72) Inventor: Ion E. Opris, San Jose, CA (US)

(*) Notice: Subject to any disclaimer, the term of this patent is extended or adjusted under 35 U.S.C. 154(b) by 0 days.

(21) Appl. No.: 14/058,425

(22) Filed: Oct. 21, 2013

(51) Int. Cl.
*H03M 1/66* (2006.01)
*H03M 1/06* (2006.01)

(52) U.S. Cl.
CPC ................................ *H03M 1/0614* (2013.01)
USPC ......................... 341/144; 341/146; 341/150

(58) Field of Classification Search
CPC .............. H03M 1/0614; H03M 1/66
USPC ........................................ 341/150, 144, 146
See application file for complete search history.

(56) References Cited

U.S. PATENT DOCUMENTS

| | | | |
|---|---|---|---|
| 6,317,069 B1 * | 11/2001 | Male et al. .................... | 341/154 |
| 6,768,438 B1 | 7/2004 | Schofield | |
| 6,788,237 B1 * | 9/2004 | Bidermann et al. .......... | 341/155 |
| 7,034,733 B2 | 4/2006 | Dedic | |
| 7,123,072 B2 * | 10/2006 | Bu et al. ........................ | 327/337 |
| 7,265,697 B2 * | 9/2007 | Tsai et al. ..................... | 341/144 |
| 7,292,172 B2 * | 11/2007 | Matsumoto et al. .......... | 341/144 |
| 8,031,098 B1 * | 10/2011 | Ebner et al. ................... | 341/146 |
| 2002/0158786 A1 * | 10/2002 | Bu et al. ........................ | 341/150 |
| 2006/0202870 A1 * | 9/2006 | Tsai et al. ...................... | 341/50 |

* cited by examiner

Primary Examiner — Jean B Jeanglaude

(57) ABSTRACT

According to some embodiments, a digital to analog converter comprises an array of input data streams. An array of differential MOS switches are all biased by a common tail current source. A data stream combiner combines and selects at each clock cycle the correct bit. Only one transistor from the switches conducts current at any time. The duration during which a switch conducts current is independent upon the fronts of the bits from the input data streams, thus rendering the switching code independent.

4 Claims, 11 Drawing Sheets

SINGLE PHASE CLOCK D/A CONVERTER WITH BUILT-IN DATA COMBINER

BACKGROUND

This invention relates to the field of electronic signal processing, and more specifically to a digital-to-analog (D/A) converter which digital input comprises two or more digital data streams.

A digital-to-analog converter translates a digital data stream into a corresponding analog signal output. High speed D/A converters are implemented almost exclusively with current steering, due to faster settling and much better dynamic performance.

At very high data rates, the input/output (I/O) interface usually works at a lower rate than the D/A core itself, thus a data multiplexer may be needed before the D/A converter. Several techniques have been proposed to reduce the code dependent errors and noise, that can result in harmonic distortion and spurs in the analog output signal. A conventional solution uses a data multiplexer and a D/A core running at twice the speed of each of the input data rates. However, this solution exhibits code dependent switching. Further, the presence of a high-speed data stream combiner is a drawback. The U.S. Pat. No. 6,768,438 describes a code independent switching technique that can improve the dynamic behavior, using a current steering pair for each data stream, all said steering pairs sharing the same tail current. This solution has the disadvantage of having multiple clock phases, leading to spurious responses. Another technique, described in the U.S. Pat. No. 7,034,733, combines an input data multiplexer with clock-shaping circuitry in order to enhance the dynamic performance, such that two phases of the clock are used. Although the circuit achieves a code independent switching at the current steering node, it appears to have a major drawback in that the actual current switching is determined by the two edges of each of the two said phases of the clock. If the phase clock generator, or the shaping circuitry, or the layout routing, introduce any kind of mismatch between the timing of the two phases of the clock, the dynamic performance will be reduced by a spur at Fsample/2 (half the sampling data rate) and Fsample/2−Fsignal (image of the signal frequency with respect to half of the sampling data rate).

It would be desirable, therefore, to provide a D/A converter section implementation combining the benefits of an input data multiplexer, a code independent switching at the current steering node, and of switching driven by a single phase clock.

SUMMARY

Aspects of the invention include a circuit comprising a current steering D/A converter section combining a plurality of switches sharing a tail current source, and a switch driver. The switch driver implements a data combiner and a clock shaper such that the actual switching of the main D/A converter is determined by a single phase of the clock. In every clock cycle, one switch is disconnected and another switch is connected between the constant current source and the differential outputs of the D/A converter. Such operation assures a code independent switching at the current steering node. The dynamic behavior of the D/A is improved by using a single clock edge to determine the actual switching timing.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The following description illustrates the present invention by way of example and not necessarily by way of limitation. Any reference to an element is understood to refer to at least one element. A set of elements is understood to include one or more elements. Any recited connection is understood to encompass a direct operative connection or an indirect operative connection through intermediary structure(s).

Figure 1:
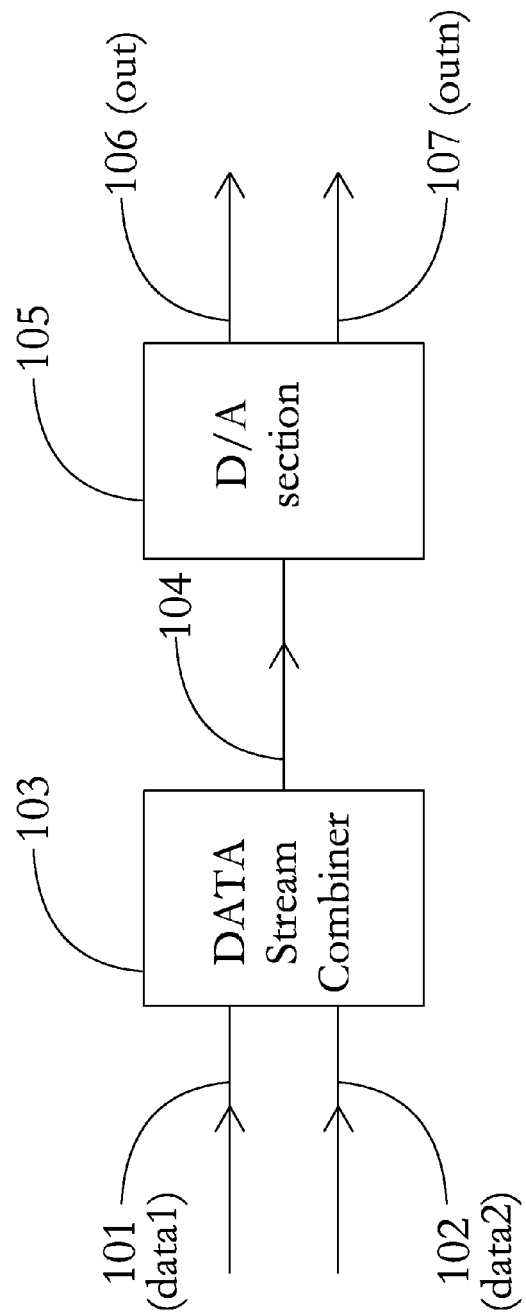
FIG. 1 shows the block diagram of a conventional high speed D/A converter using a data stream combiner (prior art).

FIG. 1 shows the block diagram of a prior art high speed D/A converter comprising two input data streams 101 and 102. The data stream combiner 103 outputs a single data stream 104, at a data rate double compared to the data rates of 101 and 102. The D/A section 105 outputs the differential currents 106 and 107. This circuit has the drawback of requiring a very high-speed data stream combiner and its switching is code dependent.

Figure 2:
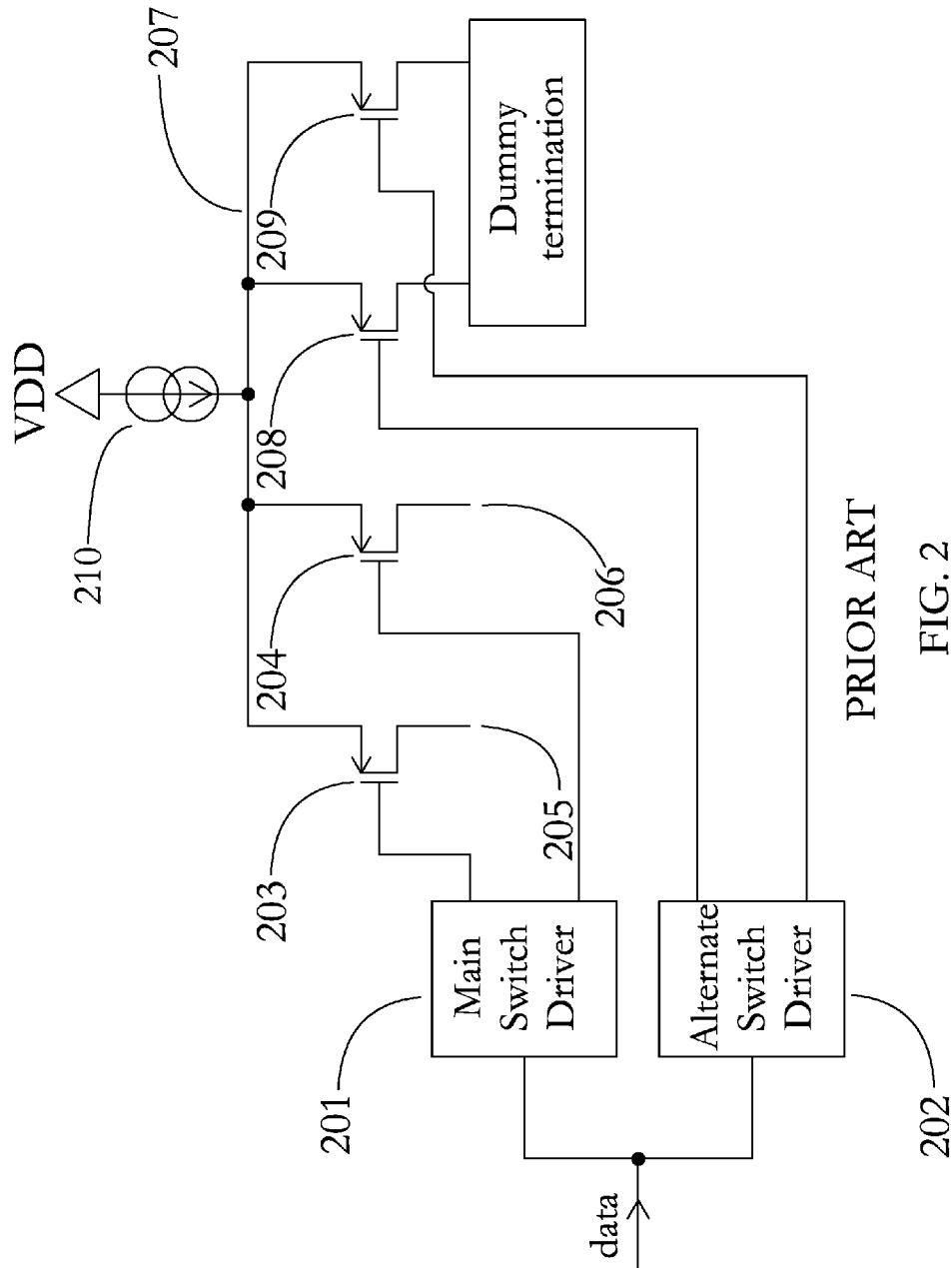
FIG. 2 shows the schematic of a conventional current D/A converter with code independent switching (prior art).

FIG. 2 shows the schematic of a prior art current D/A converter with code independent switching. The main pair 203 and 204 switches currents into the output nodes 205 and 206. A second pair 208 and 209 shares the same tail current with the main pair. The alternate switch driver 202 and the main switch driver 201 are designed such that a switching in either one of the pairs occurs at each clock, hence rendering the voltage of the tail current source code-independent.

Figure 3:
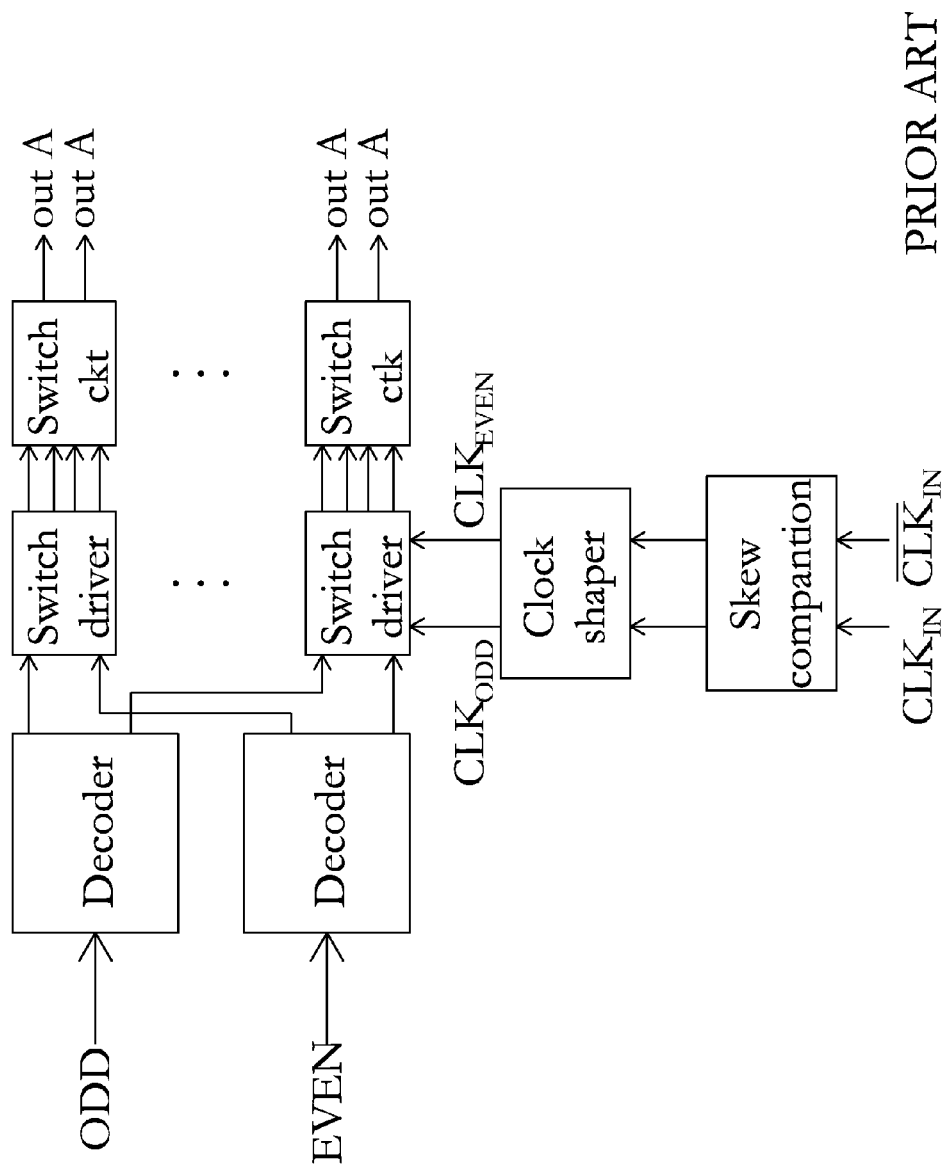
FIG. 3 shows the block diagram illustrating conventional switching circuitry for D/A converters, including a data multiplexer and clock shaping (prior art).

FIG. 3 shows the schematic of a prior art current D/A converter with code independent switching, wherein two input data streams are present. A clock shaper and an elaborate pair switching scheme is used. However, the switching is determined by a two-phases clock, leading to unequal switching times.

Figure 4:
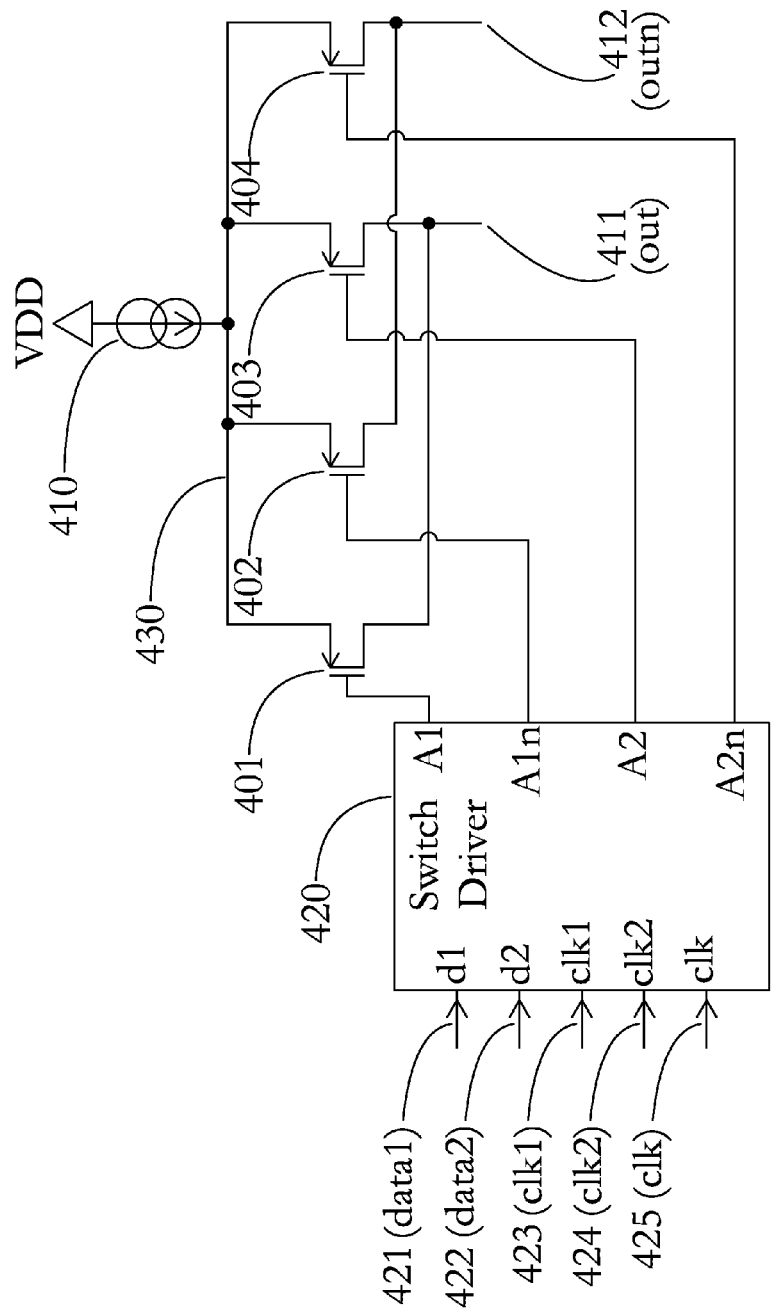
FIG. 4 shows the block diagram of a D/A converter section, according to some embodiments of the invention.

FIG. 4 shows the block diagram of a D/A converter section having two input data streams, according to some embodiments of the present invention. Four switches implemented with p-channel metal-oxide-semiconductor field-effect transistor (PMOS) devices 401, 402, 403, and 404 are connected between a constant current source 410 and the analog outputs 411 and 412. A switch driver (acting also as data combiner) 420 is used to drive the gates of the main switches according to the input data streams 421 and 422, the selection clocks 423 and 424, and the general clock input 425.

Also referring to FIG. 4, in order to enhance the dynamic performance of the D/A converter, the dynamic disturbance introduced at the current steering node 430 is substantially reduced by rendering the switching activity at the node 430 is made independent of the digital code, according to some embodiments of the present invention. During any clock cycle, only one of the switches 401-404 is turned on. During odd clock cycles, the clock 423 is active, and only one of the switches 401-404 is turned on, depending on the data input 421, while during even clock cycles, the clock 424 is active, and only one of the switches 401-404 is turned on, depending on the data input 422. Thus, every clock cycle, one of the switches 401-404 is turned on and another switch is turned off, making the switch activity at the node 430 code-independent.

Figure 5:
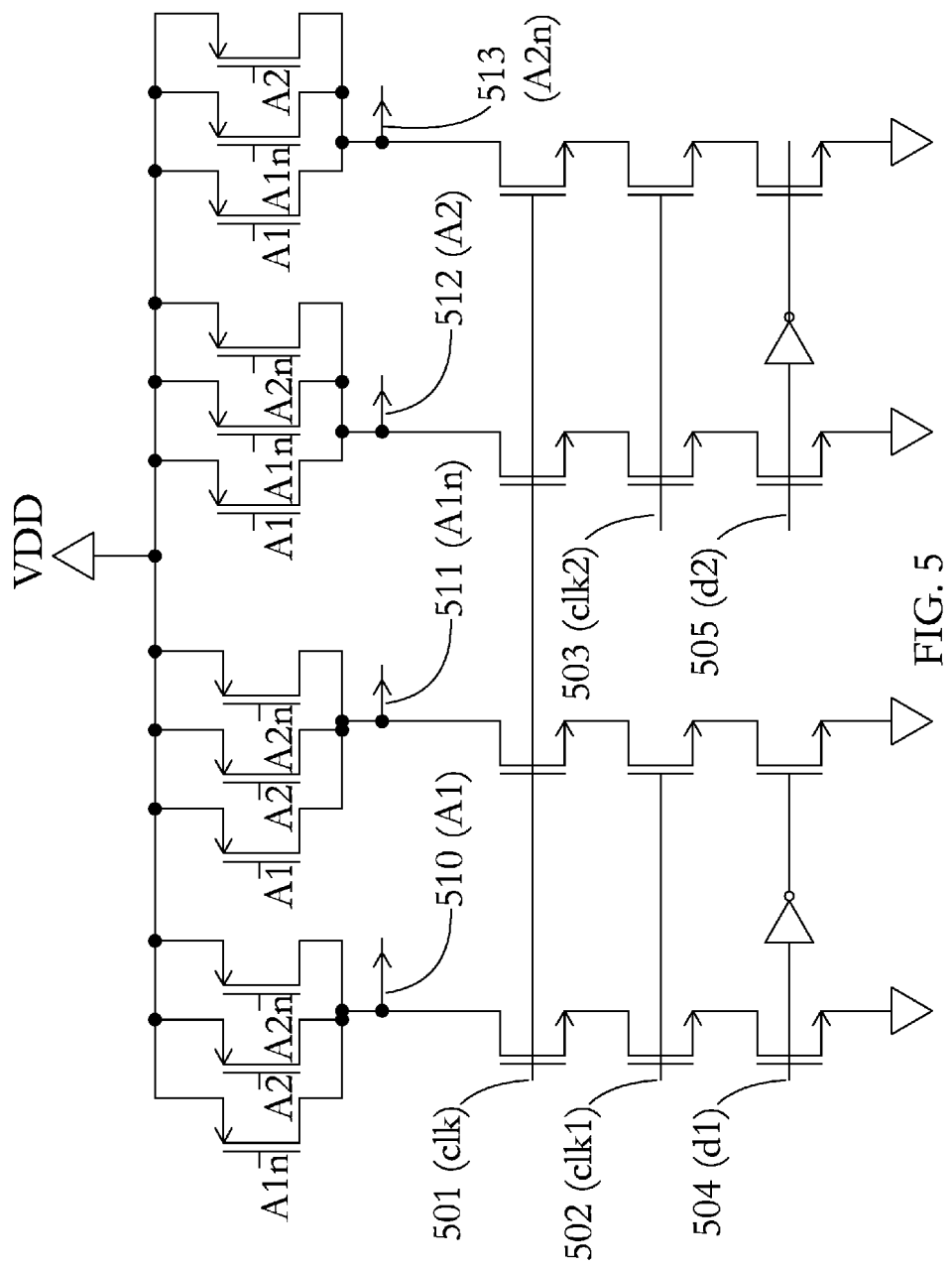
FIG. 5 shows the schematic diagram of a switch driver for the D/A converter section, according to some embodiments of the invention.

FIG. 5 shows the schematic of a switch driver which renders the timing of the switching independent of mismatches between odd/even clocks or data streams, by using a single phase of the main clock 501 (clk), according to some embodiments of the present invention. Each driver output may be pulled down by a series of three n-channel metal-oxide-semiconductor field-effect transistor (NMOS) devices, one of which is driven by the main clock signal 501 (clk), one by the selection clock 502 (clk1) or 503 (clk2), and the third one by one of the actual digital data streams 504 (d1) or 505 (d2) or the inverted digital data streams. In addition, each driver output may be pulled up by a parallel combination of PMOS devices, each of the said PMOS devices being connected to all the other driver outputs 510 to 513.

Figure 6:
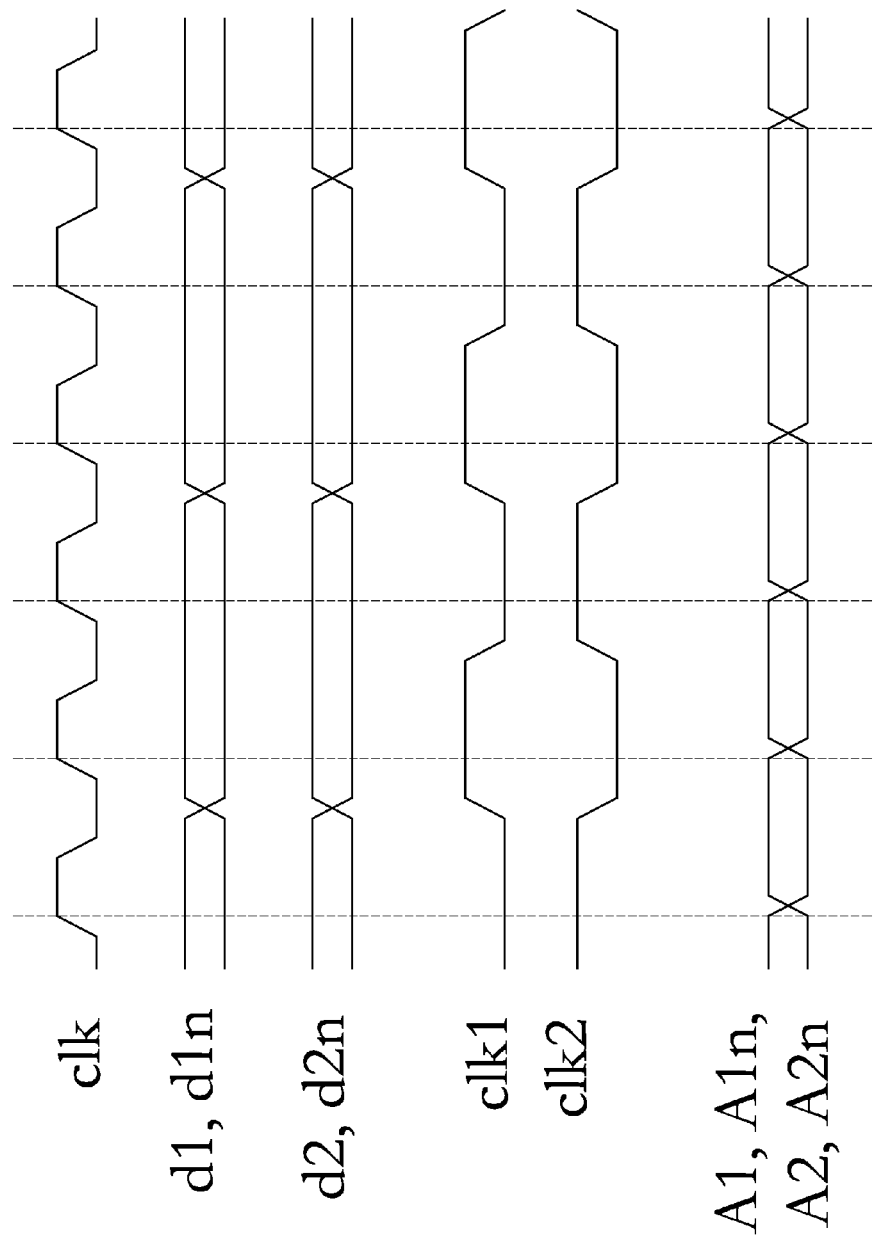
FIG. 6 shows the timing diagram of the data and clock signals disclosed in FIG. 5, according to some embodiments of the invention.

The corresponding timing diagram of the signals from FIG. 5 is shown in FIG. 6. The actual timing of the d1, d2, clk1, and clk2 signals is not important, as long as those signals are stable during the high phase of the main clock clk. At each rising edge of the main clock clk, one and only one of the four pull down series NMOS paths will be actively turned on, pulling down the corresponding driver output. Through the PMOS pull up devices, the driver output going low will actively pull up all the other driver outputs, including the one that was active low during the previous clock cycle. The active driver output in the current cycle is pulled low before the active driver output in the previous cycle is pulled high. As a consequence, at no moment during the switching duration all four transistors 401-404 are simultaneously turned off, and hence at no moment the D/A output nodes are left floating.

Therefore, the circuits disclosed in FIGS. 4 and 5 achieves several desirable features, such as, for example, combining the input data streams 421 and 422 according to the selection clocks 423 and 424, providing a switching timing such that the D/A outputs are never left floating, and having a timing sequence which is determined only by one phase of the main clock signal 425, therefore eliminating errors due to timing mismatch between other signals.

Figure 7:
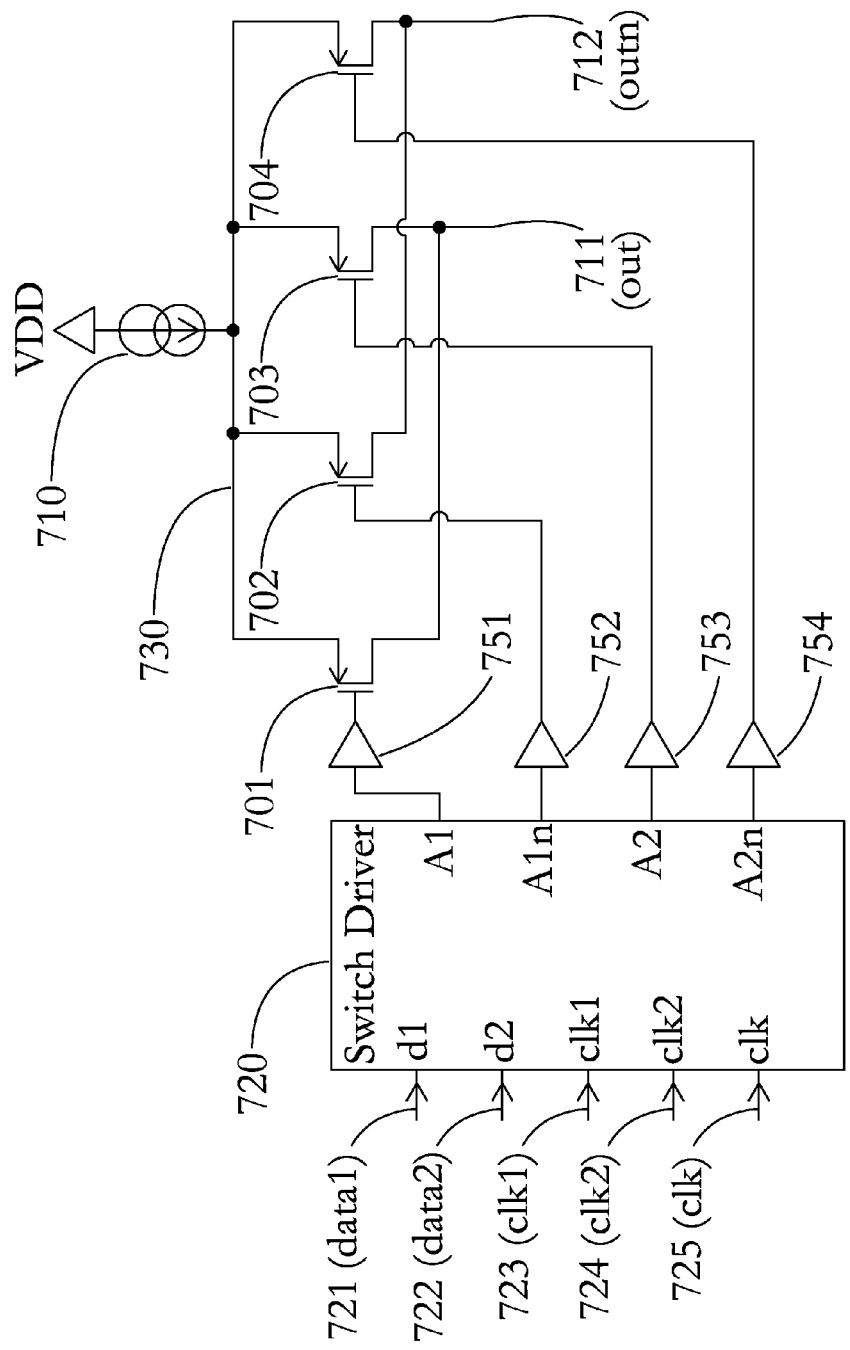
FIG. 7 shows the block diagram of a D/A converter section, according to some embodiments of the invention.

For large main D/A switches, it may be desirable to add buffers between the switch driver and the actual D/A switches, as shown in FIG. 7, according to some embodiments of the present invention.

Figure 8:
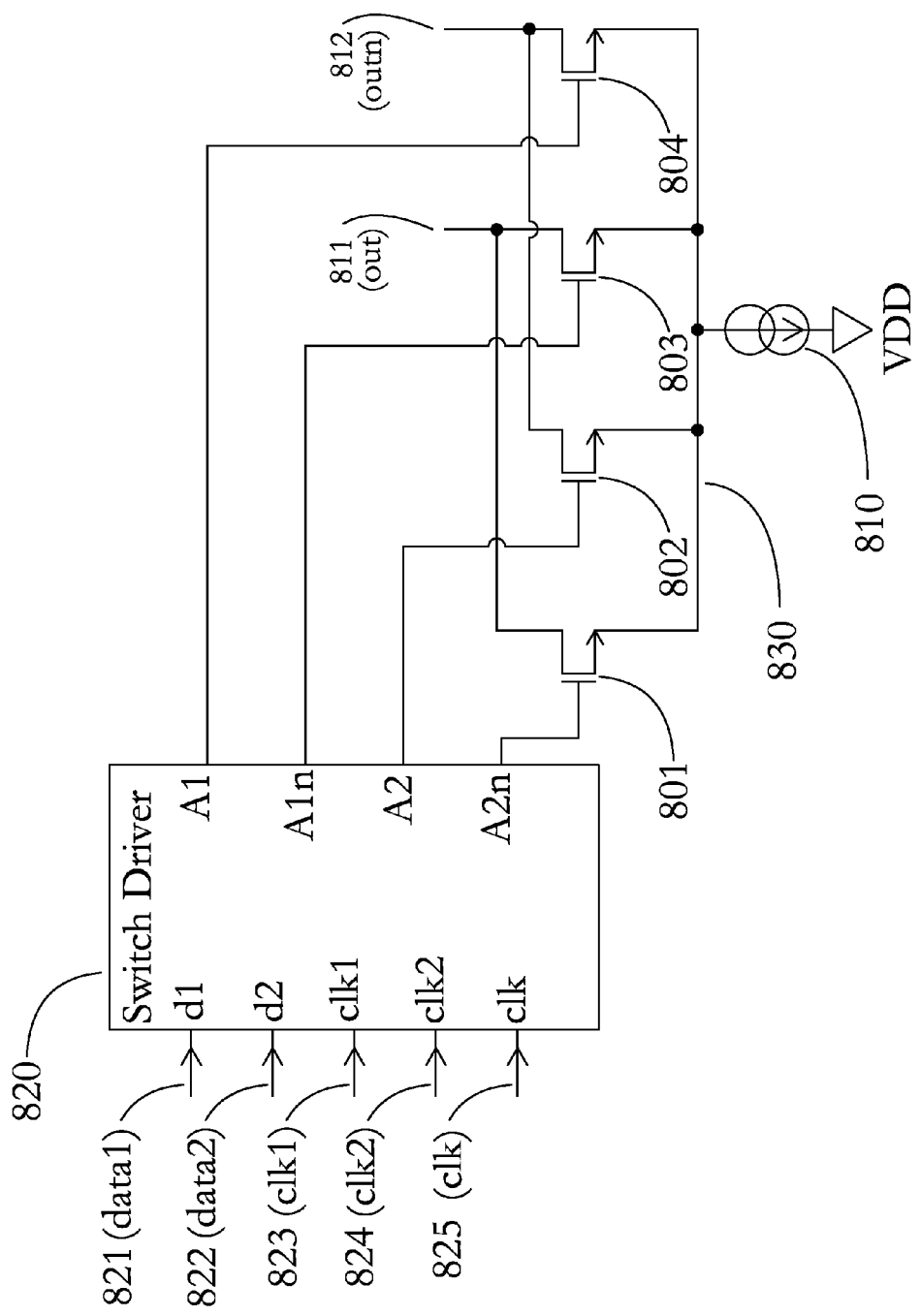
FIG. 8 shows the block diagram of a D/A converter section, according to some embodiments of the invention.

FIG. 8 shows the block diagram of a D/A converter similar to the one disclosed in FIG. 4, wherein the four main switches 801-805 are implemented using NMOS, instead of PMOS, transistors.

Figure 9:
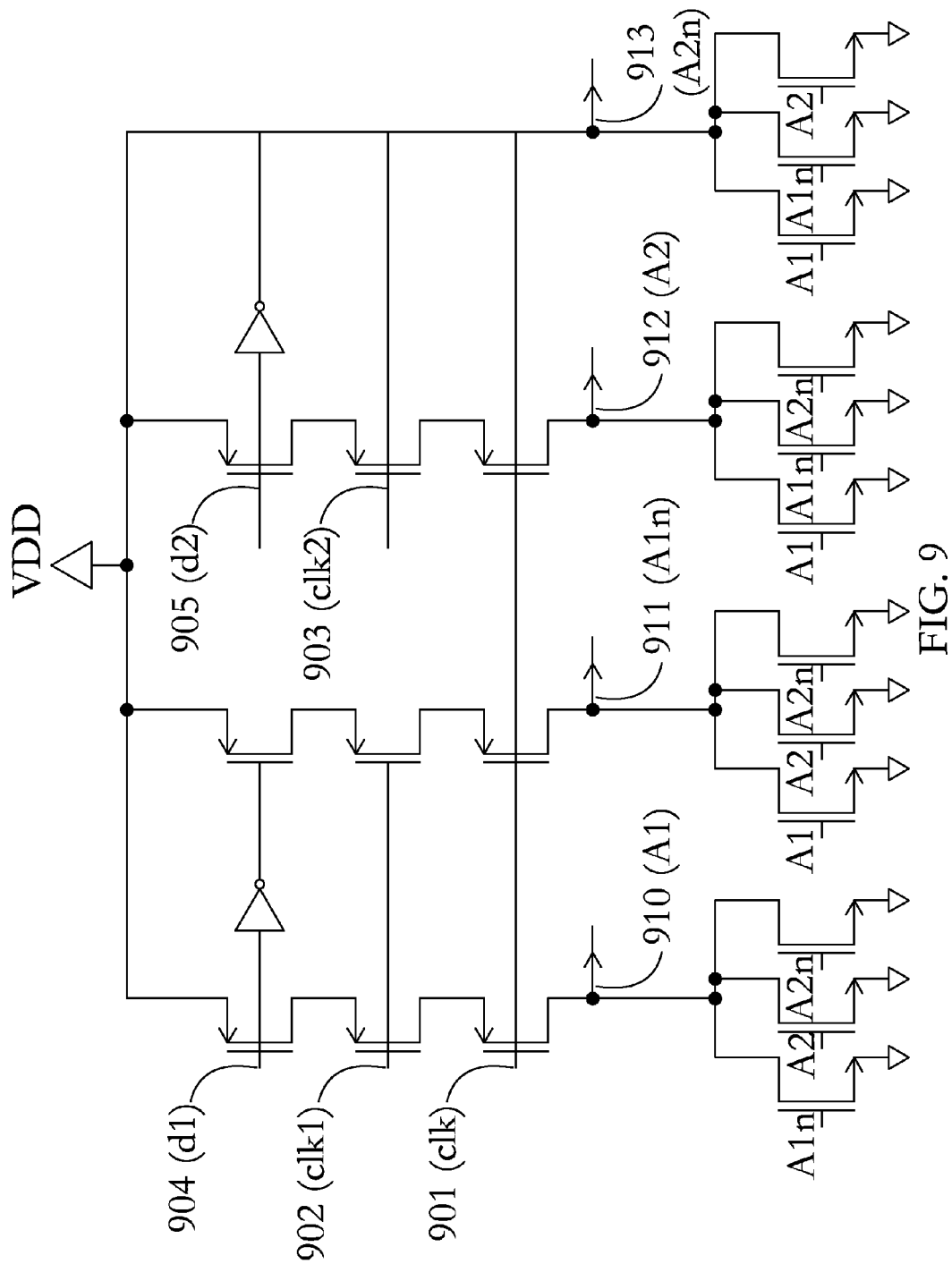
FIG. 9 shows the schematic diagram of a switch driver for the D/A converter section, according to some embodiments of the invention.

FIG. 9 shows the schematic of a switch driver similar to the one disclosed in FIG. 5, wherein the switch driver is designed to drive main switches implemented using NMOS, instead of PMOS, transistors.

Figure 10:
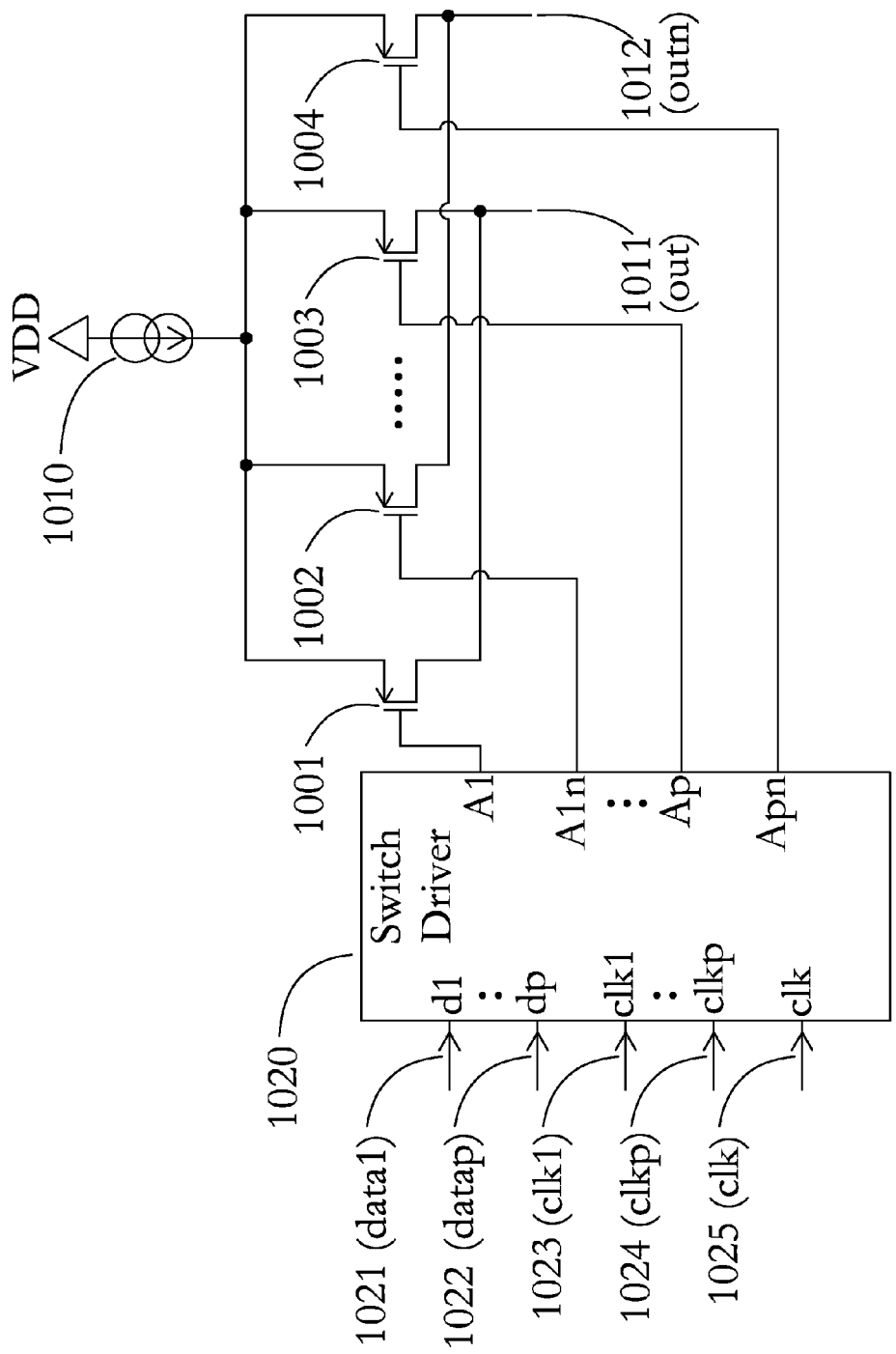
FIG. 10 shows the block diagram of a D/A converter section having p input data streams, according to some embodiments of the invention.
Figure 11:
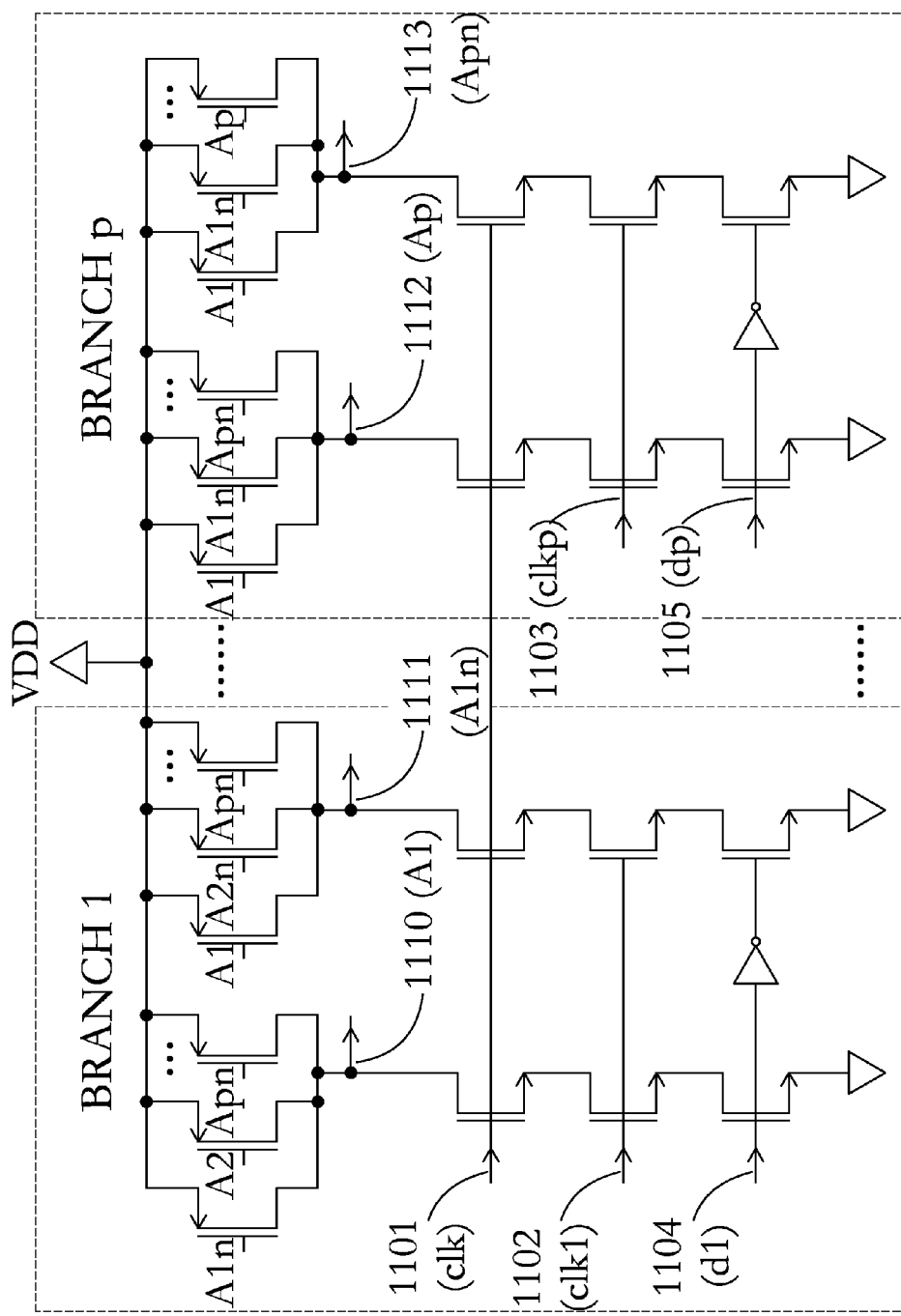
FIG. 11 shows the schematic diagram of a switch driver for the D/A converter section having p input data streams, according to some embodiments of the invention.

It will be clear to a skilled artisan that the inventions disclosed in FIGS. 5-9 can easily be extended to D/A converters having more than two input data streams. The block diagram of such an embodiment using PMOS main switches is shown in FIG. 10. The corresponding switch driver is shown in FIG. 11. Let p be number of the input data streams. The switch driver comprises p identical branches, each branch comprising three series NMOS transistors and 2*p−1 parallel PMOS transistors.

It will be clear to a skilled artisan that the inventions disclosed in FIGS. 10-11 can be implemented using complementary type transistors (PMOS instead of NMOS, and NMOS instead of PMOS).

It will be clear to one skilled in the art that the above embodiments may be altered in many ways without departing from the scope of the invention. Accordingly, the scope of the invention should be determined by the following claims and their legal equivalents.

What is claimed is:

1. A digital-to-analog converter comprising:
   an array of at least two digital input streams;
   a differential output, comprising a positive and a negative output;
   an input connected to a main clock;
   an array of inputs having as many inputs as digital input streams, connected to an array of clocks, wherein only one of the said clocks is active (logic high) at any time;
   an array of differential pairs of PMOS switches having as many pairs as digital input streams, wherein the drains of the first switch from each pair are all connected together and further connected to the said positive output, and the drains of the second switch from each pair are all connected together and further connected to the said negative output;
   a switch driver being connected to the said digital inputs, to the said main clock, to the said array of clock inputs, and to the gates of the said array of PMOS switches, the switch driver further comprising:
      an array of positive outputs, each positive output being connected to the gate of the first PMOS switch from the array of PMOS switches;
      an array of negative outputs, each negative output being connected to the gate of the second PMOS switch from the array of PMOS switches;
      a first array of MOS circuits, each MOS circuit comprising three series NMOS transistors and a group of parallel PMOS transistors, wherein in each MOS circuit:
         the first NMOS transistor has the source connected to ground and the gate connected to the said main clock;
         the second NMOS transistor has the source connected to the drain of the first transistor and the gate connected to one of the digital input streams;
         the third NMOS transistor has the source connected to the drain of the second transistor and the gate connected to one of the said array of clocks;
         the PMOS transistors have the sources connected to VDD, the drains connected to the drain of the third NMOS transistor and further connected to an output from the array of positive outputs; and
         the gate of each PMOS transistor is connected to either a positive or a negative output, with the exception of the specific output to which the drain of the PMOS transistor drain is connected; and a second array of MOS circuits, each MOS circuit comprising three series NMOS transistors and a group of parallel PMOS transistors, wherein in each MOS circuit:

the first NMOS transistor has the source connected to ground and the gate connected to the said main clock;

the second NMOS transistor has the source connected to the drain of the first transistor and the gate connected to one of the logically inverted digital input streams;

the third NMOS transistor has the source connected to the drain of the second transistor and the gate connected to one of the said array of clocks;

the PMOS transistors have the sources connected to VDD, the drains connected to the drain of the third NMOS transistor and further connected to an output from the array of negative outputs; and the gate of each PMOS transistor is connected to either a positive or a negative output, with the exception of the specific output to which the drain of the PMOS transistor drain is connected.

2. The electronic circuit from claim 1, realized in the form of a monolithic circuit.

3. A digital-to-analog converter comprising:

an array of at least two digital input streams;

a differential output, comprising a positive and a negative output;

an input connected to a main clock;

an array of inputs having as many inputs as digital input streams, connected to an array of clocks, wherein only one of the said clocks is active (logic high) at any time;

an array of differential pairs of NMOS switches having as many pairs as digital input streams, wherein the drains of the first switch from each pair are all connected together and further connected to the said positive output, and the drains of the second switch from each pair are all connected together and further connected to the said negative output;

a switch driver being connected to the said digital inputs, to the said main clock, to the said array of clock inputs, and to the gates of the said array of NMOS switches, the switch driver further comprising:

an array of positive outputs, each positive output being connected to the gate of the first NMOS switch from the array of NMOS switches;

an array of negative outputs, each negative output being connected to the gate of the second NMOS switch from the array of NMOS switches;

a first array of MOS circuits, each MOS circuit comprising three series PMOS transistors and a group of parallel NMOS transistors, wherein in each MOS circuit:

the first PMOS transistor has the source connected to VDD and the gate connected to the said main clock;

the second PMOS transistor has the source connected to the drain of the first transistor and the gate connected to one of the digital input streams;

the third PMOS transistor has the source connected to the drain of the second transistor and the gate connected to one of the said array of clocks;

the NMOS transistors have the sources connected to ground, the drains connected to the drain of the third PMOS transistor and further connected to an output from the array of positive outputs; and the gate of each NMOS transistor is connected to either a positive or a negative output, with the exception of the specific output to which the drain of the NMOS transistor drain is connected; and a second array of MOS circuits, each MOS circuit comprising three series PMOS transistors and a group of parallel NMOS transistors, wherein in each MOS circuit:

the first PMOS transistor has the source connected to VDD and the gate connected to the said main clock;

the second PMOS transistor has the source connected to the drain of the first transistor and the gate connected to one of the logically inverted digital input streams;

the third PMOS transistor has the source connected to the drain of the second transistor and the gate connected to one of the said array of clocks;

the NMOS transistors have the sources connected to ground, the drains connected to the drain of the third PMOS transistor and further connected to an output from the array of negative outputs; and the gate of each NMOS transistor is connected to either a positive or a negative output, with the exception of the specific output to which the drain of the NMOS transistor drain is connected.

4. The electronic circuit from claim 3, realized in the form of a monolithic circuit.

\* \* \* \* \*